(12) United States Patent
Yu et al.

(10) Patent No.: US 10,217,716 B2
(45) Date of Patent: Feb. 26, 2019

(54) SEMICONDUCTOR PACKAGE AND METHOD FOR FABRICATING THE SAME

(71) Applicant: MEDIATEK INC., Hsin-Chu (TW)

(72) Inventors: Ta-Jen Yu, Taichung (TW); Yu-Sheng Hung, Keelung (TW); Wen-Sung Hsu, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/638,388

(22) Filed: Jun. 30, 2017

(65) Prior Publication Data

US 2018/0076166 A1 Mar. 15, 2018

Related U.S. Application Data

(60) Provisional application No. 62/393,254, filed on Sep. 12, 2016.

(51) Int. Cl.
*H01L 21/56* (2006.01)
*H01L 23/00* (2006.01)
(Continued)

(52) U.S. Cl.
CPC .......... *H01L 24/17* (2013.01); *H01L 21/4853* (2013.01); *H01L 21/56* (2013.01); *H01L 21/6836* (2013.01); *H01L 23/3107* (2013.01); *H01L 23/3128* (2013.01); *H01L 23/49811* (2013.01); *H01L 23/5389* (2013.01); *H01L 24/81* (2013.01); *H01L 24/97* (2013.01); *H01L 25/0655* (2013.01); *H01L 25/105* (2013.01); *H01L 25/16* (2013.01); *H01L 21/561* (2013.01); *H01L 24/05* (2013.01); *H01L 24/13* (2013.01); *H01L 24/16* (2013.01); *H01L 2224/04026* (2013.01); *H01L 2224/05022* (2013.01); *H01L 2224/05124* (2013.01); *H01L 2224/05147* (2013.01); *H01L 2224/05567* (2013.01); *H01L 2224/05572* (2013.01); *H01L 2224/05624* (2013.01); *H01L 2224/05647* (2013.01); *H01L 2224/1146* (2013.01); *H01L 2224/1147* (2013.01); *H01L 2224/131* (2013.01); *H01L 2224/13082* (2013.01);
(Continued)

(58) Field of Classification Search
CPC ............... H01L 24/17; H01L 23/49811; H01L 25/0655; H01L 24/97; H01L 21/6836; H01L 21/4853; H01L 25/105; H01L 23/3128; H01L 25/16; H01L 23/3107; H01L 23/5389; H01L 24/81
USPC ........................................................ 257/531
See application file for complete search history.

(56) References Cited

U.S. PATENT DOCUMENTS

2009/0008762 A1 1/2009 Jung
2013/0175694 A1 7/2013 Shih
(Continued)

*Primary Examiner* — Fernando L Toledo
*Assistant Examiner* — Adam S Bowen
(74) *Attorney, Agent, or Firm* — Winston Hsu

(57) ABSTRACT

A method for fabricating a semiconductor is disclosed. A carrier substrate is provided. A redistribution layer (RDL) structure is formed on the carrier substrate. The RDL structure comprises at least a bump pad. A semiconductor die is mounted on the RDL structure. A molding compound is formed on the semiconductor die and the RDL structure. The carrier substrate is removed to reveal a plurality of solder ball pads of the RDL structure. A plurality of conductive structures are formed on the solder ball pads.

6 Claims, 9 Drawing Sheets

(51) Int. Cl.
*H01L 23/31* (2006.01)
*H01L 25/16* (2006.01)
*H01L 23/498* (2006.01)
*H01L 21/48* (2006.01)
*H01L 23/538* (2006.01)
*H01L 21/683* (2006.01)
*H01L 25/065* (2006.01)
*H01L 25/10* (2006.01)

(52) U.S. Cl.
CPC ............ *H01L 2224/13083* (2013.01); *H01L 2224/13111* (2013.01); *H01L 2224/13147* (2013.01); *H01L 2224/13155* (2013.01); *H01L 2224/16235* (2013.01); *H01L 2224/16237* (2013.01); *H01L 2224/73204* (2013.01); *H01L 2224/81005* (2013.01); *H01L 2224/81024* (2013.01); *H01L 2224/81191* (2013.01); *H01L 2224/97* (2013.01); *H01L 2225/1023* (2013.01); *H01L 2225/1058* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| 2014/0185264 | A1 | 7/2014 | Chen |
| 2014/0264933 | A1 | 9/2014 | Yu |
| 2015/0137384 | A1 | 5/2015 | Huemoeller |
| 2015/0179570 | A1* | 6/2015 | Marimuthu ......... H01L 25/0652 257/774 |

* cited by examiner

## SEMICONDUCTOR PACKAGE AND METHOD FOR FABRICATING THE SAME

CROSS REFERENCE TO RELATED APPLICATIONS

This application claims the priority from U.S. provisional application No. 62/393,254 filed Sep. 12, 2016.

BACKGROUND

This disclosure relates generally to the field of semiconductor packaging. More particular, this disclosure relates to a fan-out semiconductor package with a redistribution layer (RDL), a package-on-package, and methods for fabricating the same.

Fan-out wafer level packaging (FOWLP) is an embedded type packaging method during wafer level processing and is also a major advanced packaging technology for packaging a large quantity of inputs and outputs (I/O) with high integration flexibility.

Typically, in a fan-out wafer level packaging process, semiconductor dice are placed face down on a temporary tape carrier. The semiconductor dice and temporary tape carrier are overmolded with a molding compound. After molding, the tape carrier is removed, leaving the active surfaces of the semiconductor dice exposed in a structure commonly referred to as a reconstituted wafer.

Subsequently, a redistribution layer (RDL) structure is formed on top of the reconstituted wafer. Ball grid array (BGA) balls are attached onto the RDL structure and then the reconstituted wafer is singulated to form individual packages.

SUMMARY

One object of the present disclosure is to provide an improved semiconductor package and a method for fabricating the semiconductor package.

In one aspect of the disclosure, a semiconductor package is disclosed. The semiconductor package includes a redistribution layer (RDL) structure having opposite first and second surfaces. The RDL structure comprises at least a bump pad on the first surface. A semiconductor die is mounted on the first surface of the RDL structure. The semiconductor die is a flip-chip with its active surface facing toward the RDL structure. A plurality of input/output (I/O) pads is disposed on the active surface of the semiconductor die. A connecting element is disposed on each of the I/O pads. The connecting element is connected to the bump pad through solder. A molding compound encapsulates the semiconductor die and covers the first surface of the RDL structure. A plurality of conductive structure is mounted on the second surface of the RDL structure.

According to another aspect of the disclosure, a method for fabricating a semiconductor package is disclosed. A carrier substrate is provided. A redistribution layer (RDL) structure is formed on the carrier substrate. The RDL structure comprises at least a bump pad. A semiconductor die is mounted on the RDL structure. A molding compound is formed on the semiconductor die and the RDL structure. The carrier substrate is removed to reveal a plurality of solder ball pads of the RDL structure. A plurality of conductive structures is formed on the solder ball pads.

According to still another aspect of the disclosure, a package-on-package (PoP) is disclosed. The PoP includes a lower package and an upper package mounted on the lower package. The lower package includes a redistribution layer (RDL) structure having opposite first and second surfaces. The RDL structure comprises at least a bump pad on the first surface. A semiconductor die is mounted on the first surface of the RDL structure. The semiconductor die is a flip-chip with its active surface facing toward the RDL structure. A plurality of input/output (I/O) pads is disposed on the active surface of the semiconductor die. A connecting element is disposed on each of the I/O pads. The connecting element is connected to the bump pad. A molding compound encapsulates the semiconductor die and covers the first surface of the RDL structure. A plurality of through mold vias (TMVs) are formed in the molding compound. A plurality of conductive elements are mounted on the second surface of the RDL structure. The upper package is electrically connected to the lower package through the TMVs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 1 to FIG. 5 illustrate an exemplary method for fabricating a semiconductor package according to the invention, wherein FIG. 4 shows a semiconductor package with an underfill between the semiconductor die and the RDL structure, and FIG. 5 illustrates a package-on-package (PoP)

DETAILED DESCRIPTION

Figure 1:
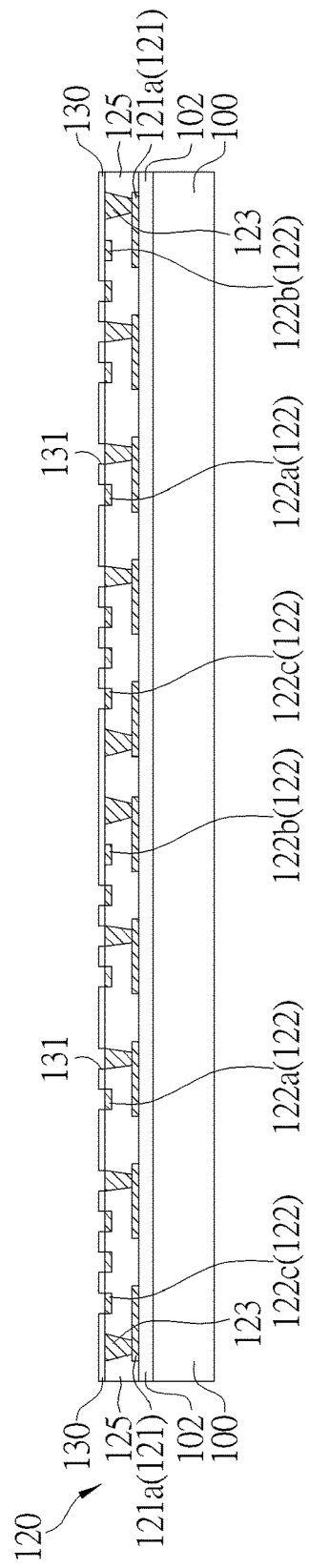

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "chip", "semiconductor chip", and "semiconductor die" are used interchangeable throughout the specification.

FIG. 1 to FIG. 5 illustrate an exemplary method for fabricating a semiconductor package according to one embodiment of the invention.

As shown in FIG. 1, a carrier substrate 100 is provided. According to one embodiment, the carrier substrate 100 may comprise glass, silicon, ceramic, metal, but is not limited thereto. According to one embodiment, a release layer 102 may be formed on a top surface of the carrier substrate 100.

A redistribution layer (RDL) structure 120 is then formed on the release layer 102. The RDL structure 120 may comprise at least a dielectric layer 125, a first metal layer 121, a second metal layer 122, and vias 123 electrically connecting the first metal layer 121 and the second metal layer 122.

According to one embodiment, for example, the first metal layer 121 may comprise conductive element pads 121a and the second metal layer 122 may comprise bump pads 122a, metal trace 122b, and pads 122c. It is understood that the layers and patterns in the RDL structure 120 as depicted in the figures are for illustration purposes only. The number of the metal layers in the RDL structure 120 may depend upon the design requirements.

According to one embodiment, the first metal layer 121 and the second metal layer 122 may comprise aluminum, copper, tungsten, titanium, titanium nitride, or the like. The dielectric layer 125 may comprise any suitable insulating materials including, but not limited to, photo image dielectric (PID) materials, prepreg, resin materials such as Ajinomoto Build-up Film (ABF) or the like.

According to one embodiment, the metal patterns in the dielectric layer 125 may be formed by build-up processes and plating processes, but is not limited thereto. In another embodiment, the dielectric layer 125 may comprise inorganic materials such as silicon oxide, silicon nitride or the like, and the metal patterns in the dielectric layer 125 may be formed by photolithographic processes and etching processes.

According to one embodiment, the metal traces or metal patterns formed in the dielectric layer 125 may have a line width ranging between 1~10 micrometers and a space (between two adjacent lines) ranging between 1~10 micrometers, but is not limited thereto.

According to one embodiment, optionally, after the formation of the RDL structure 120, a solder mask 130 may be formed on the dielectric layer 125 and the second metal layer 122. The solder mask 130 may comprise a plurality of openings 131 that expose the bump pads 122a of the second metal layer 122, respectively. Optionally, an organic solderability preservatives (OSP) film (not shown) may be applied onto the exposed surfaces of the bump pads 122a.

Figure 2:
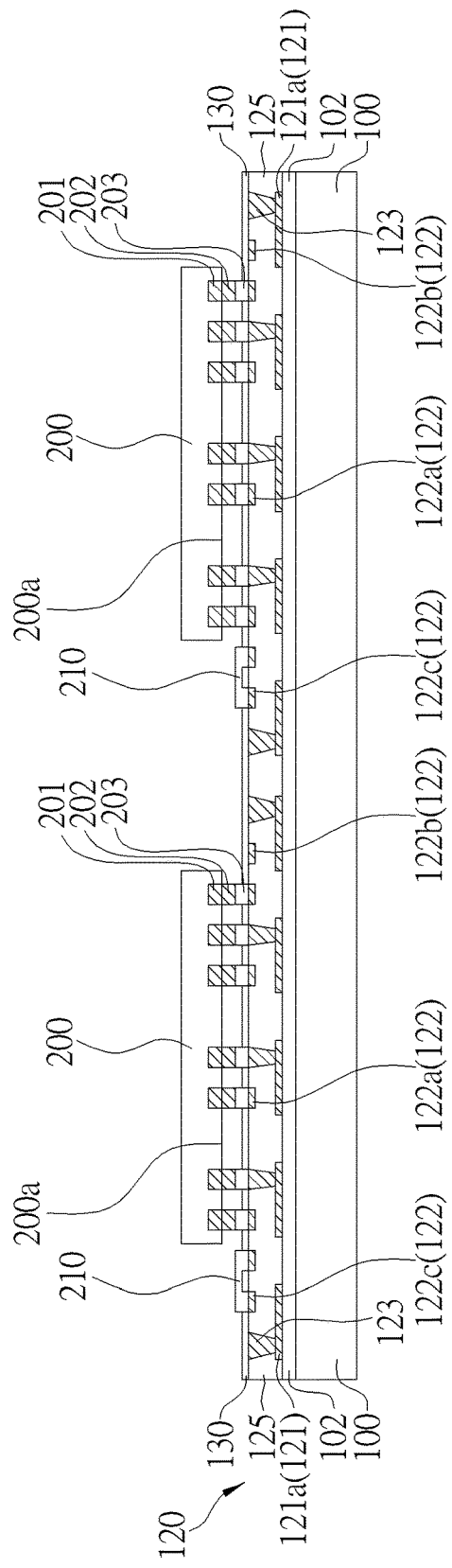

As shown in FIG. 2, after the formation of the RDL structure 120, semiconductor dice 200 are mounted within chip mounting areas on the RDL structure 120. According to one embodiment, each of the semiconductor dice 200 is a flip-chip with its active surface 200a facing down toward the RDL structure 120. A plurality of input/output (I/O) pads 201 may be disposed on the active surface 200a of each of the semiconductor dice 200. A connecting element 202 such as a metal bump or a metal pillar may be disposed on each of the I/O pads 201. The connecting element 202 is connected to a corresponding bump pad 122a through, for example, solder 203.

Optionally, a passive device 210 such as a decoupling capacitor, a resistor, or an inductor may be mounted onto the RDL structure 120. For example, the passive device 210 may be mounted on the pads 122c by using surface mount technique (SMT).

Figure 3:
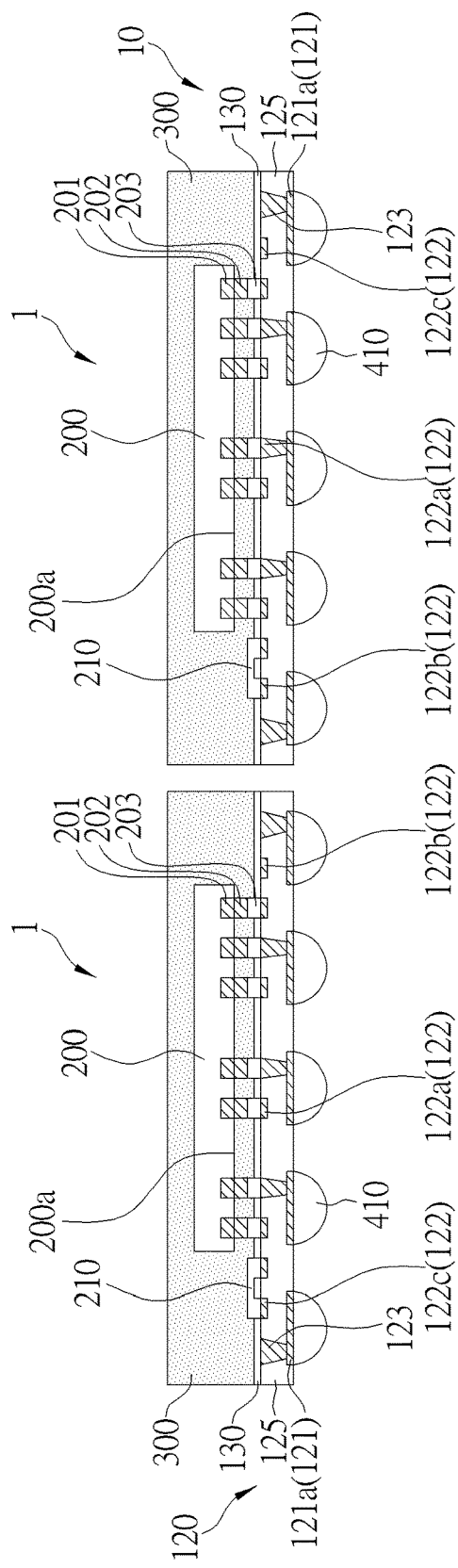

As shown in FIG. 3, after mounting the semiconductor dice 200 on the RDL structure 120, a molding compound 300 is applied. The molding compound 300 at least covers the semiconductor dice 200, the passive device 210, and the top surface of the RDL structure 120, thereby forming a wafer-level package 10. According to one embodiment, the molding compound 300 may be subjected to a curing process. The molding compound 300 may comprise a mixture of epoxy and silica fillers, but not limited thereto.

Figure 4:
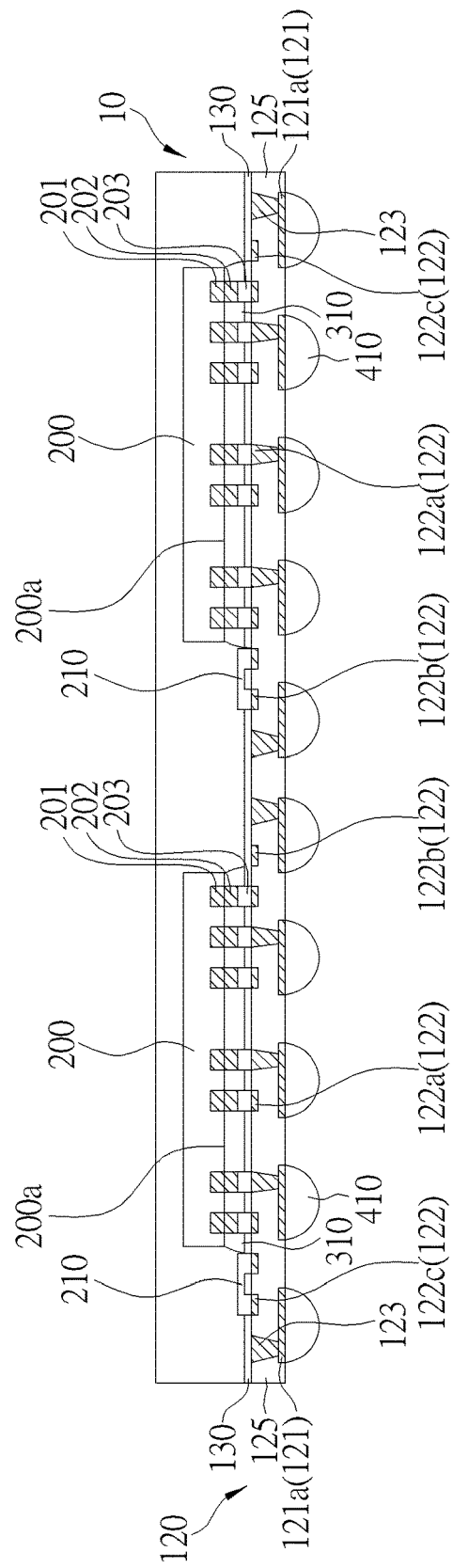

According to another embodiment, as shown in FIG. 4, prior to the formation of the molding compound 300, an underfill 310 may be applied between each of the semiconductor dice 200 and the RDL structure 120. The underfill 310 may be a silica filled epoxy, but is not limited thereto. The underfill 310 fills the gap (or standoff) between each of the semiconductor dice 200 and the RDL structure 120.

Subsequently, the carrier substrate 100 and the release layer 102 are removed to thereby expose a lower surface of the RDL structure 120. The de-bonding of the carrier substrate 100 may be performed by using heating, laser, UV/IR irradiation, or mechanical peeling, but not limited thereto. After the carrier substrate 100 is removed, the conductive element pads 121a of the first metal layer 121 is revealed.

According to one embodiment, no metal finish is formed on the conductive element pads 121a of the first metal layer 121. The thickness of the first metal layer 121 may range between 1 and 20 micrometers. According to another embodiment, a metal finish such as Ni, Au, and/or other elemental metals may be formed on the conductive element pads 121a of the first metal layer 121.

Subsequently, conductive structures 410 are disposed on respective conductive element pads 121a of the first metal layer 121 to complete a semiconductor 10. The semiconductor 10 is then subjected to a wafer dicing process and singulated into individual die packages 1. According to one embodiment, the conductive structures 410 could be solder balls, solder bumps, copper pillar bumps, or any combination thereof, but is not limited thereto.

Figure 5:
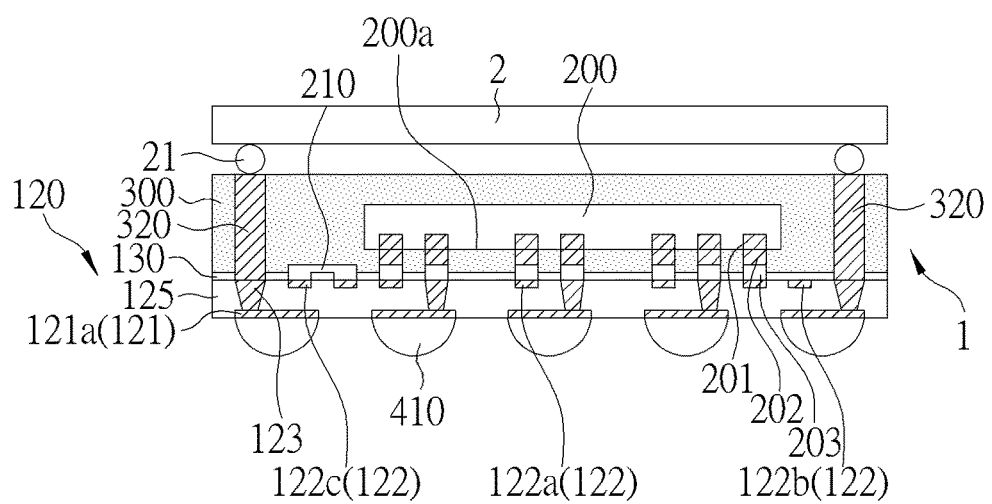

FIG. 5 is a schematic, cross-sectional diagram illustrating a package-on-package (PoP). As shown in FIG. 5, through mold vias (TMVs) 320 may be formed through the entire thickness of the molding compound 300 for further connection. According to one embodiment, the TMVs 320 may be formed by drilling through holes into the molding compound 300, then filling the through holes with metal such as copper. The TMVs 320 may be formed prior to the wafer dicing process, but is not limited thereto.

In the illustrated PoP configuration, the die package 1 functions as a lower package, an upper package 2 is mounted directly on the die package 1. For example, the upper package 2 may be a DRAM chip package, but is not limited thereto. The upper package 2 may comprise a chip (such as a DRAM chip, not shown), which may be electrically connected to the lower package through the TMVs 320 and the RDL structure 120. The upper package 2 may comprise a plurality of connecting elements 21 such as conductive structures or bumps, which is used to connect the upper package 2 with the TMVs 320.

FIG. 6 to FIG. 9 illustrate another method for fabricating TMVs and a PoP according to another embodiment of the invention, wherein like numeral numbers designate like elements, layers, or regions.

Figure 6:
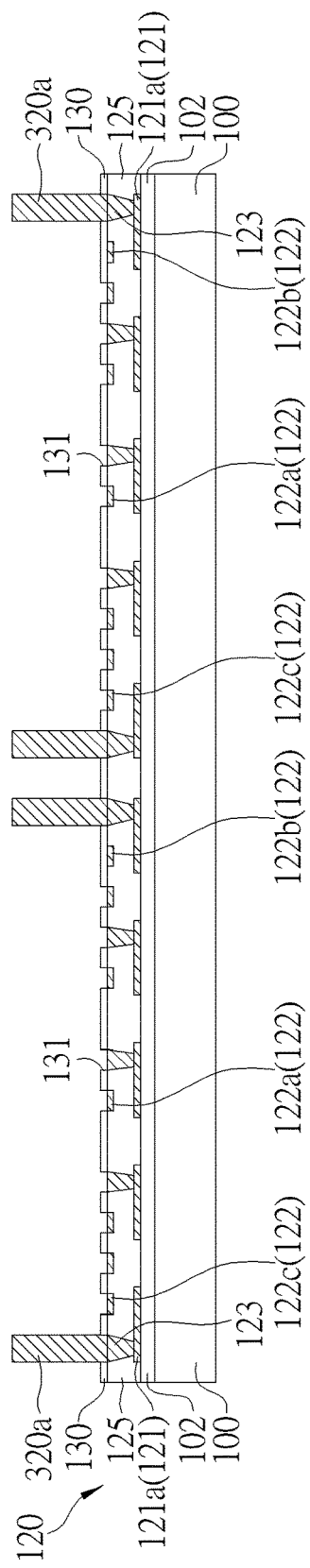
FIG. 6 to FIG. 9 illustrate an exemplary method for fabricating through mold vias (TMVs) and a PoP according to another embodiment of the invention.

As shown in FIG. 6, likewise, a carrier substrate 100 is provided. The carrier substrate 100 may comprise glass, silicon, ceramic, metal, but is not limited thereto. A release layer 102 may be formed on a top surface of the carrier substrate 100. An RDL structure 120 is then formed on the release layer 102.

The RDL structure 120 may comprise at least a dielectric layer 125, a first metal layer 121, a second metal layer 122, and vias 123 electrically connecting the first metal layer 121 and the second metal layer 122. The first metal layer 121 may comprise conductive element pads 121a and the second metal layer 122 may comprise bump pads 122a, metal trace 122b, pads 122c, and pads 122d.

After the formation of the RDL structure 120, a solder mask 130 may be formed on the dielectric layer 125 and the second metal layer 122. The solder mask 130 may comprise a plurality of openings 131 that expose the bump pads 122a of the second metal layer 122, respectively.

Subsequently, a plurality of metal pillars 320a is formed on the pads 122d at a peripheral region on the RDL structure 120. For example, to form the metal pillars 320a, a photoresist layer (not shown) is formed on the RDL structure 120. A photolithographic process is then performed to form via openings in the photoresist layer. The via openings are aligned with the pads 122d. Subsequently, metal such as copper may be deposited into the via openings by chemical vapor deposition (CVD), physical vapor deposition (PVD), atomic layer deposition (ALD), or plating process. The photoresist layer is then removed.

Figure 7:
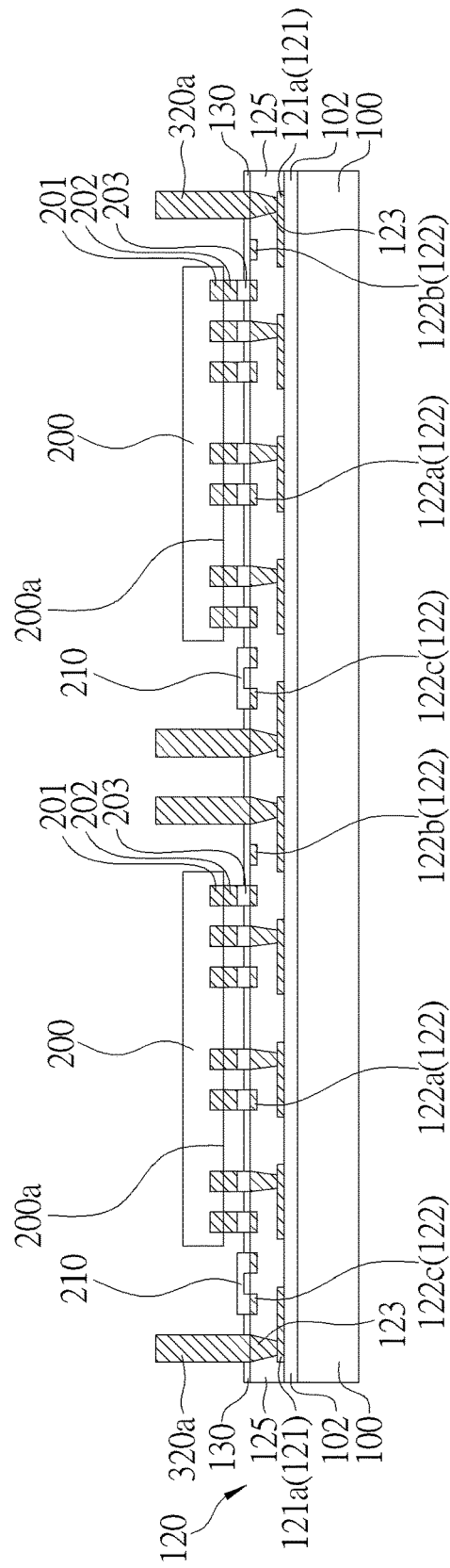

As shown in FIG. 7, after the formation of the metal pillars 320a, semiconductor dice 200 are mounted within chip mounting areas on the RDL structure 120. According to one embodiment, each of the semiconductor dice 200 is a flip-chip or die with its active surface 200a facing down toward the RDL structure 120. A plurality of input/output (I/O) pads 201 may be disposed on the active surface 200a of each of the semiconductor dice 200. A connecting element 202 such as a metal bump or a metal pillar may be disposed on each of the I/O pads 201. The connecting element 202 is connected to a corresponding bump pad 122a through, for example, solder 203.

Optionally, a passive device 210 such as a decoupling capacitor, a resistor, or an inductor may be mounted onto the RDL structure 120. For example, the passive device 210 may be mounted on the pads 122c by using surface mount technique (SMT).

Figure 8:
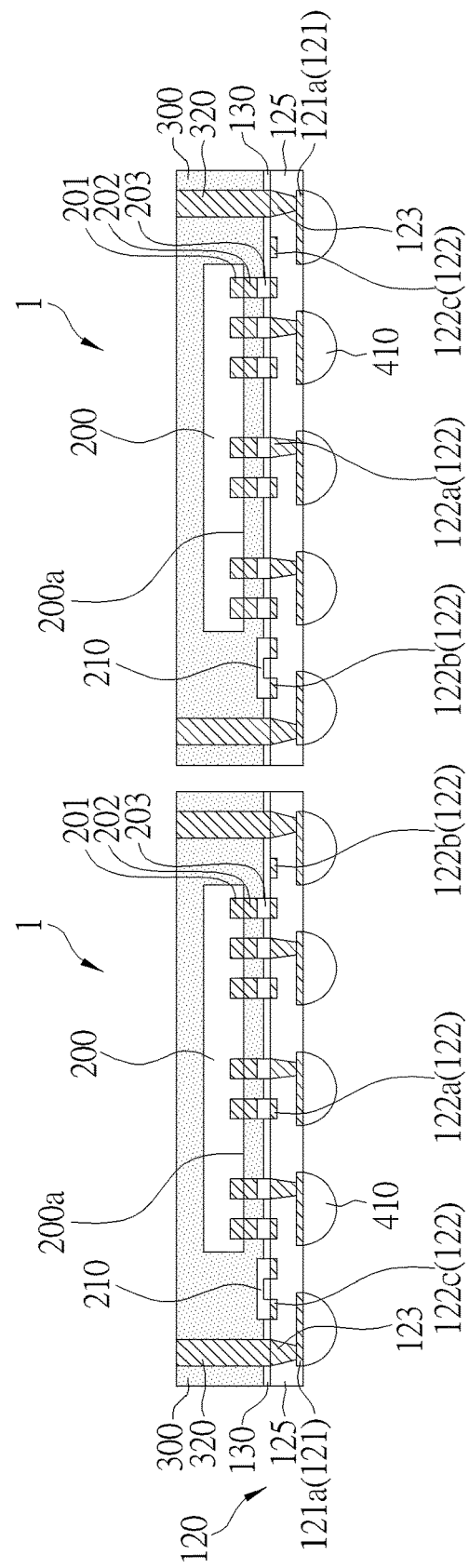

As shown in FIG. 8, after mounting the semiconductor dice 200 on the RDL structure 120, a molding compound 300 is applied. The molding compound 300 at least covers the semiconductor dice 200, the passive device 210, the metal pillars 320a, and the top surface of the RDL structure 120, thereby forming a wafer-level package 10. Optionally, a chemical mechanical polishing (CMP) process may be performed to reveal the top surfaces of the metal pillars 320a, thereby forming through mold vias (TMVs) 320.

Subsequently, the carrier substrate 100 and the release layer 102 are removed to thereby expose a lower surface of the RDL structure 120. The de-bonding of the carrier substrate 100 may be performed by using heating, laser, UV/IR irradiation, or mechanical peeling, but not limited thereto. After the carrier substrate 100 is removed, the conductive element pads 121a of the first metal layer 121 is revealed.

Subsequently, conductive structures 410 are disposed on respective conductive element pads 121a of the first metal layer 121 to complete a semiconductor 10. The semiconductor 10 is then subjected to a wafer dicing process and singulated into individual die packages 1.

Figure 9:
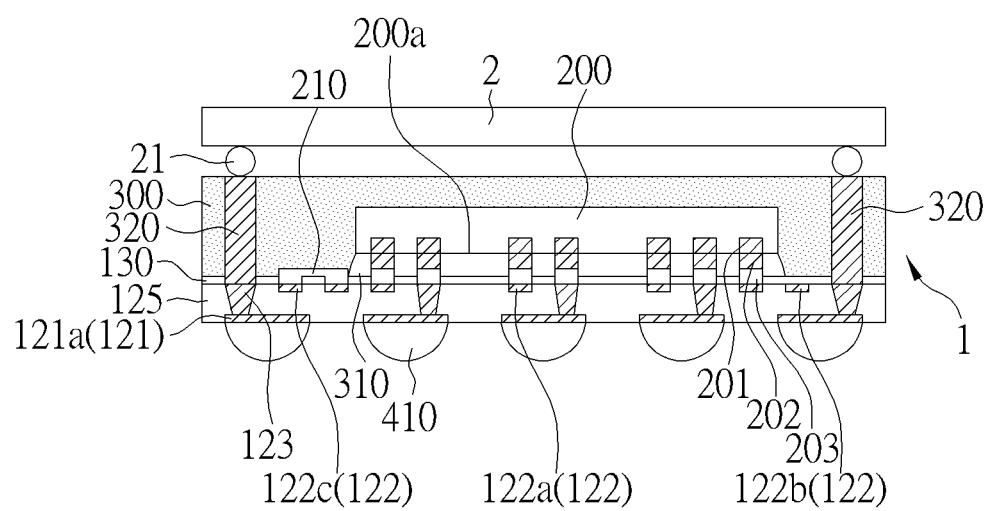

As shown in FIG. 9, an upper package 2 is mounted on the die package 1. For example, the upper package 2 may be a DRAM chip package, but is not limited thereto. The upper package 2 may comprise a chip (such as a DRAM chip, not shown), which may be electrically connected to the lower package through the TMVs 320 and the RDL structure 120. The upper package 2 may comprise a plurality of connecting elements 21 such as conductive structures or bumps, which is used to connect the upper package 2 with the TMVs 320.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor package, comprising:
a redistribution layer (RDL) structure having opposite first and second surfaces, wherein the RDL structure comprises at least a bump pad on the first surface;
a semiconductor die mounted on the first surface of the RDL structure, wherein the semiconductor die is a flip-chip with its active surface facing toward the RDL structure, wherein a plurality of input/output (I/O) pads is disposed on the active surface of the semiconductor die, and wherein a connecting element is disposed on each of the I/O pads, and wherein the connecting element is connected to the bump pad;
a passive device mounted on the first surface of the RDL structure, wherein the passive device is spaced apart from the semiconductor die;
a molding compound encapsulating the semiconductor die and covering the first surface of the RDL structure; and
a plurality of conductive structure mounted on the second surface of the RDL structure.
2. The semiconductor package according to claim 1, wherein the RDL structure comprises at least a dielectric layer, a first metal layer on the first surface, a second metal layer on the second surface, and a via layer electrically connecting the first metal layer and the second metal layer.
3. The semiconductor package according to claim 1, wherein the connecting element comprises a metal bump or a metal pillar.
4. The semiconductor package according to claim 1, wherein the connecting element is connected to the bump pad through a solder.
5. The semiconductor package according to claim 1, wherein the passive device comprises a decoupling capacitor, a resistor, or an inductor.
6. The semiconductor package according to claim 1 further comprising an underfill disposed between the semiconductor die and the RDL structure.

* * * * *